United States Patent [19]

Schade, Jr.

[11] Patent Number: 4,462,002
[45] Date of Patent: Jul. 24, 1984

[54] TRIMMING CIRCUITS FOR PRECISION AMPLIFIER

[75] Inventor: Otto H. Schade, Jr., North Caldwell, N.J.

[73] Assignee: RCA Corporation, New York, N.Y.

[21] Appl. No.: 381,733

[22] Filed: May 24, 1982

[51] Int. Cl.$^3$ ............................................. H03F 3/45
[52] U.S. Cl. ................................... 330/253; 330/257; 330/261; 330/259
[58] Field of Search ............... 330/253, 255, 257, 259, 330/261

[56] References Cited

U.S. PATENT DOCUMENTS

| | | | |
|---|---|---|---|
| 3,852,679 | 12/1974 | Schade, Jr. | 330/30 |
| 3,873,933 | 3/1975 | Wheatley, Jr. | 330/30 |
| 4,045,746 | 8/1977 | Wheatley, Jr. | 330/23 |
| 4,050,030 | 9/1977 | Russell | 330/253 |
| 4,068,182 | 1/1978 | Dingwall et al. | 330/9 |
| 4,138,649 | 2/1979 | Schaffer | 330/9 |
| 4,322,691 | 3/1982 | Malchow | 330/301 |

OTHER PUBLICATIONS

Schaffer, "A CMOS Aid Converter Circuit for Thermocouple Temp. Measurement", 1981 ISSCC Digest, pp. 60-61.

Primary Examiner—James B. Mullins
Assistant Examiner—Steven J. Mottola
Attorney, Agent, or Firm—E. M. Whitacre; P. M. Emanuel; E. P. Herrmann

[57] ABSTRACT

Imbalances in the potential appearing across the drain electrodes of source coupled FET transistors arranged in a differential amplifier configuration tends to produce input offset voltages. Where the drain electrodes of the transistors are coupled to a current mirror load for converting balanced signals to a single ended output which in turn is applied to a common source amplifier, the input offset may be nulled by differentially adjusting the drain current of the common source amplifier against the source current of the differential stage.

14 Claims, 4 Drawing Figures

TRIMMING CIRCUITS FOR PRECISION AMPLIFIER

This invention relates to circuitry for trimming the operating conditions of an operational amplifier and more particularly to circuitry for nulling the input offset potential of a differential input amplifier.

Typically differential amplifiers have a differential input stage cascaded with further gain stages terminating in an output terminal. The amplifier is connected between relatively positive V+ and relatively negative V− supply potentials for energization. The amplifier is ordinarily designed to provide an output potential that is the average of the supply potentials when the signals applied to the differential input terminals are equal. Owing to unavoidable differences in the construction of desirably "matched" devices in the input stage the desired input-output relationship rarely obtains in practice. Therefore some means to trim device parameters are included in the circuitry.

Consider a conventional differential stage including first and second transistor having their common electrodes interconnected to a constant current source, their respective control terminals connected respectively to inverting and noninverting input terminals, and their respective output electrodes connected to load elements. Consider further that a further gain stage is directly connected to the output electrode of only one of the output electrodes of the first and second transistors. Now in the balanced or quiescent state the potential appearing at the respective control electrodes of the first and second transistors is a function of both the current conducted between their output and common electrodes and the potential across their respective output and common electrodes. The single ended connection of the further gain stage, or differences in the loads connected to the output electrodes of the transistors may effect a difference in the potential across or the current through the input transistors causing a potential offset between the input terminals. To correct for this offset condition it is necessary to equilibrate the potential at the output electrodes of the input transistors.

Consider further that the load connected to the first and second transistors is a current mirror amplifier (CMA) which produces therewith a single ended output and that the further gain stage is a common-emitter amplifier. In the "balanced" state, input current to the further stage will tend to unbalance the current to the CMA if it does not exactly equal the CMA input component, creating an effective input offset. Therefore it is desirable to include circuitry for re-establishing balanced currents to the CMA.

Heretofore, offset nulling circuits have commonly included degeneration resistors in the emitter electrodes of the CMA transistors with provision for connecting a relatively high impedance balancing potentiometer between the resistors. This technique changes differential-pair offsets by changing their current apportionment, and is often difficult to apply for small corrections. Further it does not directly address the problem of potential differences of the output electrodes (at balance), which may be the primary cause for imbalance errors in an otherwise well-balanced amplifier.

It is an object of the present invention to provide circuitry for accurately balancing potentials and currents internal to a differential stage for nulling input offsets and more generally, providing a better transistor transfer-characteristic match.

SUMMARY OF THE INVENTION

The present invention comprises a differential amplifier having a differential input stage and a further gain stage coupled thereto. The differential input stage includes first and second emitter/source coupled amplifying transistors with their output electrodes coupled to a balanced-to single-ended CMA load.

A bipolar transistor has its base electrode connected to the input connection of the CMA. Circuitry is provided for varying the emitter potential of the bipolar transistor to increase/decrease input current to the CMA via the bipolar transistor input base current.

The further gain stage is a common emitter/source amplifier having its base/gate electrode connected to the output terminal of the CMA. The collector/drain load of the gain stage is a constant current source with means for adjusting such current to develop in the common emitter/source transistor a base-emitter (gate-source) potential to balance the output potentials of the first and second input transistors. In one embodiment the source current to the first and second amplifier transistors is differentially adjusted with respect to the load current source of the common-emitter/source stage.

DETAILED DESCRIPTION OF THE INVENTION

Figure 1:
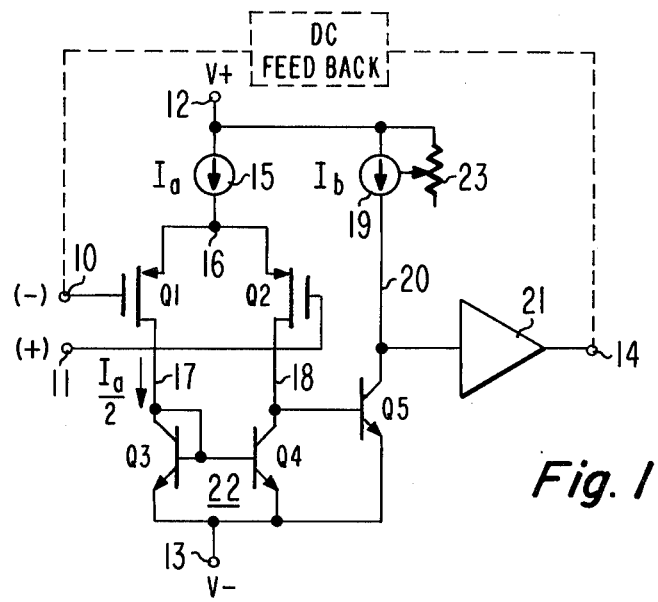
FIG. 1 is a schematic diagram of a differential amplifier with provision for adjusting the operating current of an intermediate gain stage for nulling input offset voltage.

FIG. 1 shows an operational amplifier typically constructed within the confines of a monolithic integrated circuit. This circuit has provided terminals 12 and 13 for the application of relatively positive V+ and relatively negative V− operating potentials. Inverting input terminal 10 and non-inverting input terminal 11 are coupled to the respective gate electrodes of p-type FET transistors Q1 and Q2 connected as a source-coupled amplifier. Transistors Q1 and Q2 are used as the input stage of the operational amplifier. The source electrodes of transistors Q1 and Q2 are connected to a constant-current source 15 for supplying them with combined source currents. The drain currents of transistors Q1 and Q2 are applied to the input and output terminals, respectively of CMA 22 including transistors Q3 and Q4 and which act as a balanced-to-single-ended signal converter, converting the push-pull variations in the drain currents of transistors Q1 and Q2 to a single ended signal current applied to the base electrode of transistor Q5. Transistor Q5 is a common emitter amplifier transistor included in an intermediate amplification stage of the operational amplifier. Constant-current source 19 provides an active collector load for transistor Q5, and the signal appearing at the collector electrode of transistor Q5, responsive to the signal current applied to its base electrode, is applied to the input of a further amplifier stage 21. The response of stage 21 is available at the signal output terminal 14.

CMA 22 includes transistor Q3 having a direct coupled collector-to-base feedback connection that adjusts its base potential to condition it for conducting a collector current supplied by transistor Q1 less the relatively small base currents of transistors Q3 and Q4. Since the emitter potentials of transistors Q3 and Q4 are equal, their equal base potentials condition transistors Q3 and Q4 to conduct respective collector currents in the same ratio to each other as their respective transconductances. Assuming transistors Q3 and Q4 have similar diffusion profiles and applied collector-emitter potentials, their respective transconductances are related in the same ratio as the effective areas of their base-emitter junctions. To carry out balanced to single-ended signal conversion it is usually desired that the current gain of CMA 22 as between the collector electrodes of transistors Q3 and Q4 be minus unity, in which case transistors Q3 and Q4 are made with equal base-emitter junctions.

The potential at the drain electrode 17 of transistor Q1 is defined by the collector potential of transistor Q3 which is one $V_{BE}$ above the negative supply potential V−. The potential at the drain electrode 18 of transistor Q2 is clamped by the base-emitter junction potential of transistor Q5 and is a $V_{BE5}$ potential above the negative supply, where $V_{BE5}$ is the base emitter potential of transistor Q5. In the balanced or quiescent state, ideally, the current Ia, supplied by source 15 is divided equally between the drain currents of transistor Q1 and Q2 and consequently the collector currents of transistors Q3 and Q4. Nominally the current Ib, provided to the collector of transistor Q5 is several times greater than the collector current Ia/2 in transistor Q3. In addition, the base-emitter junctions of Q3 and Q4 are scaled in the same ratio as their collector currents so that $V_{BE5}$ will equal $V_{BE3}$ and the drain source potentials of transistors Q1 and Q2 (and collector-base potentials of transistors Q3 and Q4) will match. Normally neither the currents Ia/2 and Ib nor the geometry of Q3 and Q5 can be precisely scaled. The end result is that $V_{BE3}$ does not precisely equal $V_{BE5}$. Consequently the potentials at the drain electrodes 17 and 18 of transistors Q1 and Q2 will be mismatched. Since there is an inter-relationship between drain current, drain voltage and gate-source voltage, and since the source electrodes of transistors Q1 and Q2 are at the same potential, the source current Ia is equally split between Q1 and Q2 (i.e. in the balanced state) a mismatch in drain potential will give rise to a mismatch in gate potential. This mismatch in gate potential is exhibited at input terminals 10 and 11 as an input offset. A similar condition obtains if bipolar transistors are substituted for FET transistors Q1 and Q2. In addition, the $V_{BE3}/V_{BE5}$ mismatch changes the ideal CMA 1:1 current ratio due to collector potential Early Effect causing further input offset of Q1 and Q2.

If the operational amplifier of FIG. 1 is operated with feedback between output terminal 14 and the inverting input terminal 10, the present inventor found that the input offset can be effectively nulled by adjustment of the load current Ib without significantly altering amplifier performance. The potentiometer 23, coupled to current source 19 in FIG. 1, is intended to indicate that source 19 is variable. The base emitter potential $V_{BE5}$ of transistor Q5 and thereby the drain potential 18 is increased (decreased) by increasing (decreasing) the amplitude of Ib. Proceeding from the following well-known equation describing bipolar transistor operation, one can develop a feeling for the magnitude of changes in $V_{BE5}$ to be expected:

$$V_{BE}=(kT/q) \ln (I_C/I_S) \tag{1}$$

where
$V_{BE}$ is the base-emitter potential of the transistor,
k is Boltzmann's constant,
T is the absolute temperature at which the transistor is operated,
q is the charge on an electron,
$I_C$ is the transistor collector current, and
$I_S$ is the value of $I_C$ for $V_{BE}=0$.

It has been found that a change of only a few percent in the collector current $I_b$ is generally all that is required to null the circuit due to $V_{BE}$ potential differences affecting the drain (collector) potentials of the differential pair. In contrast to conventional offset nulling arrangements this circuit adjusts Ia/2 versus Ib rather than adjusting the Ia/2 components in the two sides of the differential pair. The present method produces an actual voltage balance at the drain electrodes of transistors Q1 and Q2 (and Q3/Q4) as opposed to a differential pair differential current adjustment.

Two aspects will be noted. First, the operational amplifier must have a feedback correction to effect the $V_{BE5}$ voltage change with the adjustment of collector current Ib. The base-emitter (gate-source) potential determines the collector (drain) current that can be conducted in a given transistor. Without provision, e.g., feedback, for altering the base-emitter potential of the gain stage transistor Q5, merely increasing or decreasing the current amplitude Ib from source 19 cannot change the collector current of the transistor. However, when feedback is included an increase in current $I_b$ increases the Q5 collector electrode potential at connection 20, which increase is proportionally translated via the feedback connection to the inverting input terminal 10. An increase in the potential on terminal 10 is amplified without phase inversion at the differential stage output connection 18 conditioning transistor Q5 to conduct the additional load current. The potential change at connection 18 is the parameter used to null the input offset.

Secondly, the input differential pair may be realized with bipolar transistors and the CMA with FETs. In general, however, the CMA transistors and transistor Q5 should be of the same type and conductivity. In addition, the operative current density of transistors Q3 and Q5 should be matched as nearly as possible.

Figure 2:
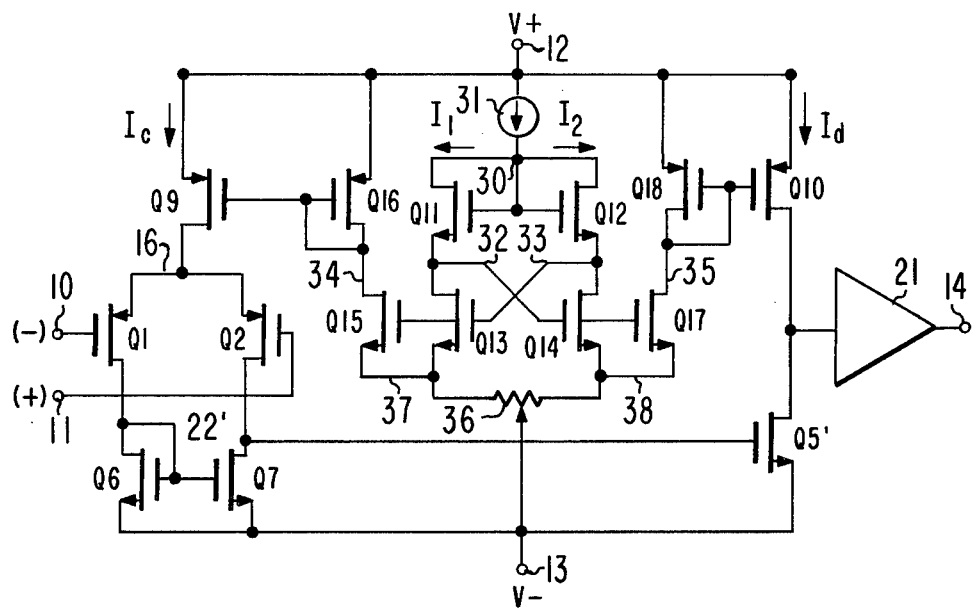
FIG. 2 is a schematic diagram of a differential amplifier with provision for differentially adjusting the operating currents of an intermediate gain stage against the operating current of the differential input stage for nulling input offset voltage.

FIG. 2 is a variation on the FIG. 1 operational amplifier. In the FIG. 2 circuit the CMA load 22' connected to the input differential pair and the intermediate gain transistor Q5' are FETs rather than bipolar devices. The circuit in general is operationally similar to the FIG. 1 amplifier.

In FIG. 2, offset nulling is accomplished by adjusting both the source current Ic to the differential stage transistors Q1 and Q2 and simultaneously adjusting in complementary fashion the drain current $I_D$ to transistor Q5'. The current $I_C$ is increased/decreased for the current $I_D$ being decreased/increased. The currents $I_C$ and $I_D$ are differentially adjusted, i.e., adjusted in the opposite polarity sense but not necessarily by equal increments. The offset voltage being a function of the drain-source current of transistors Q1 and Q2, adjusting the DC value of their bias current will tend to affect the offset voltage. The amplitude of the Q1, Q2 source current tends to influence the value of their drain potentials independently of the transistor Q5' gate-source potential. It will be readily appreciated that increasing the source current $I_C$ will increase the drain-source potential of transistor Q6 and thereby the drain potential of Q1. Simultaneously a reduction in drain current $I_D$ to transistor Q5' will reduce its gate-source potential and thereby the drain potential of transistor Q2. Thus differential adjustment of supply currents $I_C$ and $I_D$ provides an effective way to match or balance the drain potentials of Q1 and Q2, as well as the drain potentials of transistors Q6 and Q7.

A decrease in the transconductance of the transistor Q5' due to a decrease in its operating current $I_D$ is compensated by an increase in the transconductance of the differential pair transistors Q1 and Q2 due to a complementary increase in the current $I_C$ and vice versa. Thus the composite gain of the cascaded stages is not significantly altered by an offset null adjustment.

Transistors Q16 and Q9 are arranged as a CMA to provide constant source current to transistors Q1 and Q2. Transistor Q9 reflects proportionately the current conducted in transistor Q16 supplied thereto at node 34 by the drain of transistor Q15. Transistors Q10 and Q18 are connected as a further CMA to provide constant current $I_D$ to transistor Q5'. Transistor Q10 reflects proportionately the current conducted in the drain of transistor Q18 supplied at node 35 by transistor Q17.

Transistors Q11, Q12, Q13, Q14, Q15 and Q17, and potentiometer 36 form a current amplifier providing constant output currents at nodes 34 and 35 proportional to the current $I_{31}$ supplied by the constant current source 31 at connection 30. Potentiometer 36 provides a temperature-stable differential adjustment of the output currents at the nodes 34 and 35. Assume that transistor Q11 is similar to Q12 and transistor Q13 is similar to Q14. The drain-source conduction path of transistor Q11 is serially connected with the drain-source conduction path of transistor Q13 so that both conduct a current $I_1$ which is a portion of current $I_{31}$. Similarly, the drain-source conduction path of transistor Q12 is serially connected with the drain-source conduction path of transistor Q14 so that both conduct current $I_2$ which is a portion of current $I_{31}$ complementary to $I_1$. That is, $I_1 + I_2 = I_{31}$. The respective source electrodes of transistors Q13 and Q14 connect to circuit nodes 37 and 38, respectively, across which is connected the resistance path of potentiometer 36. The wiper of potentiometer 36 is connected to the relatively negative supply terminal 13. Thus, current $I_1$ flowing in Q13 is conducted by a first resistance path (left hand portion of potentiometer 36) to terminal 13 while the current $I_2$ in Q14 is conducted by a second resistance path (right hand portion of potentiometer 36) to terminal 13.

The potential differences between nodes 30 and 37 and between nodes 30 and 38 are maintained equal independent of the relative values of currents $I_1$ and $I_2$. Specifically, the gate of Q13 connects to the drain of Q14 and the gate of Q14 connects to the drain of Q13. That cross-coupling causes each of the node 30–37 and node 30–38 difference potentials to include the gate-source potential of a transistor conducting current $I_1$ plus the gate-source potential of a transistor conducting current $I_2$ so that modulation of the transistor gate-source potentials by variations of $I_1$ and $I_2$ do not produce variations in the current gain of the current amplifier. With the aforementioned potential differences thus being equal, it is readily seen that the currents $I_1$ and $I_2$ are substantially determined by the relative resistances of the left and right portions of potentiometer 36 as determined by the position of the wiper. Thus, values of currents $I_1$ and $I_2$ are given by $$I_1 = [(I_{31}/2) + \delta]$$

$$I_2 = [(I_{31}/2) - \delta]$$

where $\delta$ indicates a current imbalance owing to the adjustment of potentiometer 36.

Transistors Q15 and Q17 are connected with their respective gate and source electrodes to like electrodes of transistors Q13 and Q14 respectively. Because transistor Q15 receives a gate-source potential equal to that of transistor Q13, its drain-source current will be proportionally related to the drain-source current $I_1$ of transistor Q13. Similarly, the drain current of transistor Q17 is proportionally related to the current $I_2$ flowing in transistor Q14. Those proportional relationships are determined by the respective ratios of the "active area" of transistor pairs Q13, Q15 and Q14, Q17. For FET's "active area" is the ratio of their channel-width to channel-length (W/L ratio). Other circuitry for producing currents with proportional opposite-sense rates of change is described in U.S. Pat. No. 4,322,691 which is incorporated herein by reference.

Referring again to FIG. 1 where a bipolar CMA 22 is employed as an active load for transistors Q1 and Q2, in the balanced state an input offset potential between connections 10 and 11 will be produced due to base error currents. Base error current is the difference between the current shunted from connection 17 by the base electrodes of transistors Q3 and Q4 and the current shunted from connection 18 by the base electrode of transistor Q5. It will be readily appreciated that for transistors Q3, Q4 and Q5 having relatively high beta, their base currents will be small and the base error current even smaller. Thus, it is difficult to precisely generate a compensating current to correct for the error.

Figure 3:
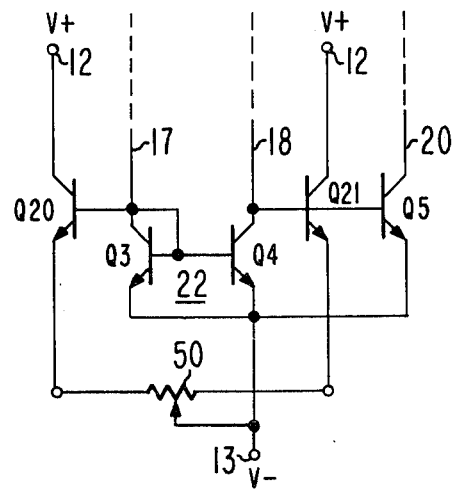
FIGS. 3 and 4 are partial schematics of current mirror load circuitry for a differential amplifier stage with provision for compensating transistor base error currents.
Figure 4:
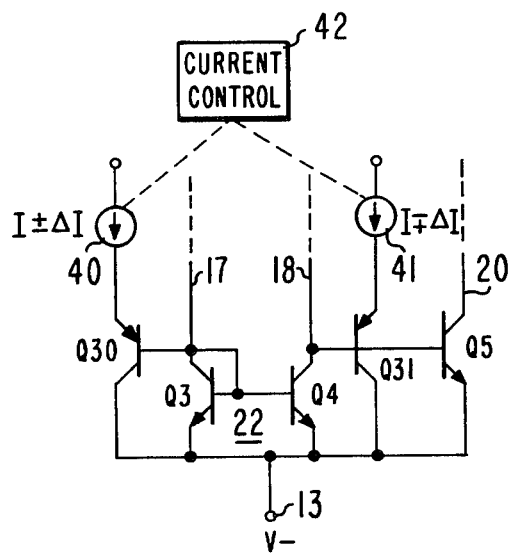

FIGS. 3 and 4 are similar embodiments of a technique for compensating the extremely small base current error and thereby providing an input offset null adjustment for the amplifier. In FIGS. 3 and 4, circuit elements having the same designations as circuit elements in FIG. 1 are the same or similar, e.g., the CMA 22 in FIGS. 3 and 4 correspond to the CMA 22 in FIG. 1. In FIG. 3 a transistor Q20 is connected to the CMA 22 with its base electrode connected to the base electrodes of transistor Q3 and Q4 and its collector electrode connected to the positive supply terminal 12. Its emitter electrode is coupled to the negative supply terminal via the potentiometer 50. The base electrode of transistor Q20 shunts additional current from connection 17. Extremely small adjustments to the additional current shunted from connection 17 may be achieved with relatively coarse adjustments of potentiometer 50. This obtains because the change in Q20 base current is $1/\beta$th the change in Q20 emitter current, ($\beta$ being the forward current gain of transistor Q20 which is typically 200 or larger). The change in transistor Q20 base current $\Delta I_{b20}$ as a function of a change $\Delta R$ in potentiometer 50 resistance R may be determined by summing the voltage drops in the loop including the base-emitter junctions of transistors Q3 and Q20 and the resistance between the emitter electrode of transistor 20 and the potentiometer 50 wiper, i.e. $I_{E20}R + V_{BE20} - V_{BE3} = 0$ where $I_{E20}$ is the emitter current of transistor Q20 and R is the portion of resistor 50 between Q20 and the wiper electrode. The base current $I_{B20}$ may be calculated by solving for $I_{E20}$ and dividing by $\beta$. The differential change $\Delta I_{b20}$ in base current $I_{b20}$ for changes, $\Delta R$, in the resistance is calculated by taking the first derivative of the current $I_{b20}$ with respect to R and multiplying the result by the change in resistance $\Delta R$ and is approximated by $$\Delta I_{b20} \approx -\Delta R(V_{BE3} - V_{BE20})/(\beta R^2).$$

In general the quantity $(V_{BE3} - V_{BE20})$ will be at most several tenths of a volt and R will be 1 kilo Ohm. Varying the potentiometer resistance 10 percent will change $\Delta I_{b20}$ only $1.5 \times 10^{-7}$ amperes at most. Thus it can be seen that extremely fine adjustments can be made. Since the error and correction currents are both related to transistor forward current gain, and the corrective and operating transistors may be located in close proximity to one another, they will tend to track each other, i.e., maintain a constant parametric relationship with respect to process and termperature changes.

Adding a second transistor Q21 with its base electrode connected at connection 18 and its emitter electrode connected to potentiometer 50 permits a current adjustment to connection 18 complementary to the current adjustment to connection 17.

In FIG. 3 the base electrodes of transistors Q3, Q4 and Q5 shunt current out of connections 17 and 18. In addition the base electrodes of balancing transistors Q20 and Q21 shunt current from connections 17 and 18. The FIG. 4 circuit employs balancing transistors Q30 and Q31 of opposite conductivity type to the amplifier transistor Q3, Q4 and Q5. As a result the base currents of Q30 and Q31 tend to replace the base current shunted by transistors Q3, Q4 and Q5.

The emitter electrodes of transistors Q30 and Q31 are supplied emitter current by constant current sources 40 and 41 respectively. Sources 40 and 41 are ganged to be simultaneously adjustable (42) to produce complementary changes in emitter currents supplied to transistors Q30 and Q31. Note the complementary adjustable current sources may be realized by circuitry similar to the current amplifier described in the foregoing discussion with respect to FIG. 2.

What is claimed is:

1. In an amplifier having a differential input stage including first and second input transistors each having respective control, and respective output electrodes and having common electrodes connected to a common node for receiving constant operating current, the respective output electrodes being respectively connected to the input and output connection of a CMA, said amplifier having a further gain stage including a further transistor having a control electrode connected to said output connection of the CMA, a common electrode coupled to a common electrode of said CMA and having a constant current source connected as a load to its output connection, wherein said amplifier is susceptible of input offset voltages between the respective control electrodes of said first and second transistors, said amplifier including apparatus for nulling said offset voltage comprising:
   means for adjusting the amplitude of the constant current source connected as a load to the output electrode of said further transistor.

2. The amplifier set forth in claim 1 further including means for adjusting said constant operating current applied to the common electrodes of the first and second transistors, the change in said constant operating current being simultaneous with, and complementary to the change in constant current supplied to the output electrode of said further transistor.

3. The amplifier set forth in claim 1 or 2 wherein said CMA is susceptible of base error current, said amplifier including further input offset nulling apparatus comprising:
   a bipolar transistor having a base electrode connected to one of said CMA input and output terminals, and having a collector electrode connected for applying supply potential for normal operation; and
   adjustable means for supplying constant current to an emitter electrode of said bipolar transistor.

4. The amplifier set forth in claim 3 including a second bipolar transistor having a base electrode connected to the other of said CMA input and output electrodes not connected to the base of said first bipolar transistor and having an emitter connected for receiving constant current, said constant current being adjustable in complementary fashion to the constant current supplied to the emitter electrode of said first bipolar transistor.

5. The amplifier set forth in claim 3 wherein the adjustable means for supplying constant current comprises a potentiometer connected between the emitter electrode of said first bipolar transistor and a reference potential and arranged for varying the resistance therebetween.

6. An amplifier comprising:
   first and second transistors having respective common, input and output electrodes, the common electrodes being interconnected for applying constant current thereto conditioning said first and second transistors to operate as a differential amplifier;
   a current mirror amplifier having input, output and common terminals, said current mirror amplifier input and output terminals being respectively connected to the output electrodes of the first and second transistor;
   a third transistor having an input and common electrodes respectively connected to the output and common terminals of the current mirror amplifier, and having an output electrode connected for receiving constant bias current;
   degenerative feedback means connected between the output electrode of said third transistor and one of said input electrodes of said first and second transistors; and
   means for adjusting said constant bias current to the output electrode of said third transistor to null offset potentials appearing between said input terminals of said first and second transistors.

7. The amplifier set forth in claim 6 including means to simultaneously adjust in a complementary manner the bias current applied to the output electrode of said third transistor and said constant current applied to the interconnection of the common electrodes of said first and second transistors.

8. The amplifier set forth in claim 6 or 7 wherein the current mirror amplifier includes bipolar transistors and said third transistor is arranged as a common-emitter amplifier.

9. The amplifier set forth in claim 6 or 7 wherein the current mirror amplifier includes field effect transistors and said third transistors is arranged as a common-source amplifier.

10. In a differential amplifier having inverting and non-inverting input terminals susceptible of input offset potentials therebetween when biased in the nominally balanced condition, said differential amplifier having push-pull output terminals connected to the input and output terminals of a current mirror amplifier to produce a single-ended output, said current mirror amplifier being susceptible to base error currents tending to contribute to said input offset potentials, apparatus for compensating said base error current comprising:

a bipolar transistor having a base electrode connected to one of said input and output terminals of the current mirror amplifier, having a collector electrode connected for receiving supply potential for normal transistor operation, and having an emitter electrode; and means for applying operating current to said emitter electrode, said means being adjustable and wherein adjustment of said emitter current will generate a corresponding adjustment for compensating base current provided by the base electrode of the bipolar transistor.

11. The amplifier set forth in claim 10 wherein the means for applying operating current to said emitter electrode is a potentiometer connected between said emitter electrode and a point of reference potential arranged for varying an electrical resistance therebetween.

12. The amplifier set forth in claim 10 further including a second bipolar transistor having a base electrode connected to the other of said current mirror amplifier input and output terminals, not coupled to said bipolar transistor, having a collector electrode connected for applying supply potential for normal transistor operation and means for applying constant operating current to the emitter electrode of said second bipolar transistor said means being adjustable and wherein adjustment of said emitter current of said second bipolar transistor will produce a corresponding change in base current to said second bipolar transistor for compensating base error current.

13. The amplifier set forth in claim 12 wherein the respective means for applying operating current to the emitter electrodes of the bipolar and second bipolar transistors are adjustable in a complementary sense.

14. The amplifier set forth in claim 12 wherein the respective means for applying constant operating current to the emitter electrodes of the bipolar and second bipolar transistors comprises a potentiometer having first and second end terminals and a wiper terminal, said first and second end terminals being connected to the emitter electrodes of the bipolar and second bipolar transistors respectively and said wiper terminal being connected to a point of fixed potential.

* * * * *